United States Patent
Kim et al.

(10) Patent No.: US 8,306,241 B2
(45) Date of Patent: Nov. 6, 2012

(54) METHOD AND APPARATUS FOR AUTOMATIC VOLUME CONTROL IN AN AUDIO PLAYER OF A MOBILE COMMUNICATION TERMINAL

(75) Inventors: Gang-Youl Kim, Suwon-si (KR); Sang-Ki Kang, Suwon-si (KR); Jae-Hyun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1796 days.

(21) Appl. No.: 11/516,587

(22) Filed: Sep. 7, 2006

(65) Prior Publication Data
US 2007/0053528 A1 Mar. 8, 2007

(30) Foreign Application Priority Data
Sep. 7, 2005 (KR) ........................ 10-2005-0083259

(51) Int. Cl.
*H04B 15/00* (2006.01)
*H03G 3/00* (2006.01)
(52) U.S. Cl. ..................... 381/94.3; 381/94.7; 381/94.2; 381/94.1; 381/104; 381/107
(58) Field of Classification Search ........... 381/94.1–94, 381/3, 94.5, 94.7, 102–109
See application file for complete search history.

(56) References Cited

U.S. PATENT DOCUMENTS

| 6,240,192 B1 * | 5/2001 | Brennan et al. | 381/314 |
| 7,542,577 B2 * | 6/2009 | Kiuchi | 381/96 |
| 2006/0188104 A1 * | 8/2006 | De Poortere | 381/57 |

FOREIGN PATENT DOCUMENTS
KR  1999-0059602  7/1999
* cited by examiner

*Primary Examiner* — Devona Faulk
(74) *Attorney, Agent, or Firm* — Roylance, Abrams, Berdo & Goodman, LLP

(57) ABSTRACT

An automatic gain controller and a method using the same are provided. The automatic gain controller and method analyze background noise by operating a microphone mounted in a mobile communication terminal and automatically control the gain of the signal part which is non-audible due to the background noise. Thus, a user may listen to music by using an earphone or a headphone connected to the mobile communication terminal in an environment with background noise. The method includes receiving an audio signal to be reproduced, receiving a background noise signal introduced through a microphone, controlling a gain of the audio signal by comparing the background noise signal and the audio signal and outputting the gain-controlled audio signal so that the user can listen to the gain-controlled audio signal.

22 Claims, 4 Drawing Sheets

METHOD AND APPARATUS FOR AUTOMATIC VOLUME CONTROL IN AN AUDIO PLAYER OF A MOBILE COMMUNICATION TERMINAL

CROSS-REFERENCE TO RELATED APPLICATIONS

This application claims the benefit under 35 U.S.C. §119(a) of Korean Patent Application No. 2005-83259 filed Sep. 7, 2005 in the Korean Industrial Property Office, the entire disclosure of which is hereby incorporated by reference.

BACKGROUND OF THE INVENTION

1. Field of the Invention

The present invention relates to an audio player of a mobile communication terminal. More particularly, the present invention relates to a method and an apparatus for automatic volume control in an audio player of a mobile communication terminal, which adaptively controls the volume of the audio player according to environmental noise.

2. Description of the Related Art

Recently, technologies for reproducing audio files in order to listen to music by using mobile terminals are being widely used. However, when a user tries to reproduce audio files by using a mobile communication terminal in order to listen to music through an earphone or a headphone in a noisy environment such as subway train, street, park, etc., the user may experience great difficulty in listening to the music due to the surrounding noise. Especially, human auditory characteristics include a masking effect, which implies a phenomenon in that, from among audio signals sensed by auditory organs, a signal having a sufficiently large amplitude on the frequency axis or time axis covers small signals around the signal and prevents the small signals from being heard. In other words, in an environment in which background noise is larger than audio signals on the frequency axis or time axis, it is very hard or nearly impossible to hear the audio signal.

When a user listens to an audio signal by using a portable audio player in a noisy environment, such as street, etc., the user usually sets the volume as high as possible due to the background noise. Such a high volume may cause damage to the user's auditory organs and the background noise still disturbs hearing of the relatively small amplitude parts.

Recently, various technologies for eliminating such environmental noise have been proposed. One conventional technology for eliminating environmental noise is to use an earphone which includes a peripheral portion made from a special material in order to shield the user's auditory organ from the environment. This earphone basically intercepts the environmental noise in order to make the user hear only the intended audio signals. However, because the internal shapes or structures of ears are different according to each user, it is difficult to completely intercept the environmental noise and may cause inconvenience to users who have worn the earphone for a long time. Further, the conventional earphone is made from an expensive material and may cause the user to feel deafened just after wearing the earphone.

Another conventional technology for eliminating environmental noise is to use headphones, which receive environmental noise in real time by using a microphone attached to an exterior of the headphones and generate a signal with the same level and an inverse phase of those of the received real time noise inside of the headphone, thereby offsetting the environmental noise. This technology is called "Active Noise Cancellation." In order to achieve the ANC inside of the headphones, it is necessary to invert the phase of the background noise input through the microphone and then generate a signal with the inverted phase inside of the headphones. These steps require a separate power source mounted in the headphones, which increases the power consumption. Further, addition of the power source increases the weight of the headphones and degrades their portability. Moreover, since the noise level in an inner environment and an outer environment of the headphones occasionally changes according to the wearing state of the headphones by the user, the noise may still remain inside of the headphones. Therefore, the conventional headphones are advantageous only for elimination of special noise rather than various kinds of unknown noise and are not useful for temporally changing noise.

Accordingly, there is a need for an improved method and apparatus for automatic volume control in a mobile communication terminal.

SUMMARY OF THE INVENTION

Exemplary embodiments of the present invention address at least the above problems and/or disadvantages and provide at least the advantages described below. Accordingly, an exemplary object of the present invention is to provide an automatic gain controller and a method using the same, which analyzes background noise by operating a microphone mounted in a mobile communication terminal and automatically controls the gain of the signal part which is non-audible due to the background noise, while a user listens to music by using an earphone or a headphone connected to the mobile communication terminal in an environment with background noise.

In order to accomplish this exemplary object, there is provided a method for controlling a volume of an audio signal reproduced by a mobile communication terminal equipped with a microphone, the method comprising receiving an audio signal to be reproduced, receiving a background noise signal introduced through the microphone, controlling a gain of the audio signal by comparing the background noise signal and the audio signal, and outputting the gain-controlled audio signal so that the user can listen to the gain-controlled audio signal.

In accordance with another exemplary aspect of the present invention, there is provided a mobile communication terminal, which is equipped with a microphone and can reproduce an audio signal, the mobile communication terminal comprising a first analysis filter bank for receiving an audio signal to be reproduced and dividing the audio signal into individual frequency band audio signals, which correspond to the multiple frequency bands, respectively, a second analysis filter bank for receiving a background noise signal introduced through the microphone and dividing the background noise signal into individual frequency band background noise signals, which correspond to multiple frequency bands, respectively, a gain determiner for determining individual band gains of the multiple frequency bands and a global band of an overall frequency band including the multiple frequency bands by using the individual frequency band audio signals and the individual frequency band background noise signals, an individual band gain controller for multiplying the individual frequency band audio signals by the individual band gains, respectively, a synthesis filter bank for producing a synthesized audio signal by synthesizing products of the multiplication between the individual frequency band audio signals and the individual band gains and a global gain controller for generating a gain-controlled audio signal by multiplying the synthesized audio signal by the global gain.

BRIEF DESCRIPTION OF THE DRAWINGS

The above and other exemplary objects, features and advantages of the present invention will be more apparent from the following detailed description taken in conjunction with the accompanying drawings, in which.

Throughout the drawings, the same drawing reference numerals will be understood to refer to the same elements, features, and structures.

DETAILED DESCRIPTION OF EXEMPLARY EMBODIMENTS

The matters defined in the description such as a detailed construction and elements are provided to assist in a comprehensive understanding of the embodiments of the invention and are merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Exemplary embodiments of the present invention provide a mobile communication terminal, which collects environmental noise through a microphone mounted in the mobile communication terminal and controls a gain of an audio signal by analyzing the collected noise, while the mobile communication terminal reproduces the audio signal.

Figure 1:
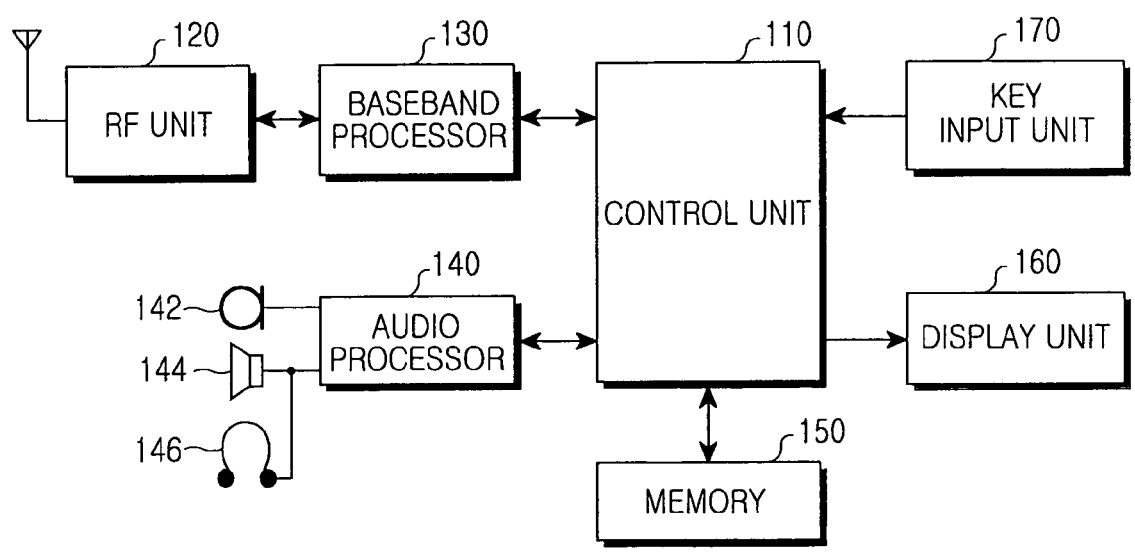
FIG. 1 is a block diagram schematically illustrating a structure of a mobile communication terminal according to an exemplary embodiment of the present invention.

FIG. 1 is a block diagram schematically illustrating a structure of a mobile communication terminal according to an exemplary embodiment of the present invention. As shown, the mobile communication terminal 100 includes a control unit 110, a Radio Frequency (RF) unit 120, a baseband processor 130, an audio processor 140, a memory 150, a display unit 160, and a key input unit 170.

Referring to FIG. 1, the control unit 110 controls the general operation of the mobile communication terminal 100. To this end, the control unit 110 includes a Digital Signal Processor (DSP), a microprocessor, and other circuits. The RF unit 120 exchanges wireless signals with a mobile communication network including a base station and a switching center. The RF unit 120 includes mixers, amplifiers, filters, and the like, in order to up-convert an outgoing signal into an RF band signal or down-convert an incoming signal to a baseband signal. In order to process a baseband signal, the baseband processor 130 includes modulators, demodulators, encoders, decoders, and the like.

Under the control of the control unit 110, the audio processor 140 converts the signal from the RF unit 120 into audible sound and outputs the converted audible sound through a speaker 144 or an earphone 146, and converts the sound input through a microphone 142 into a signal and then provides the converted signal to the baseband processor 130. Usually, the speaker 144 is connected to an output port of the audio processor 140 only when the earphone 146 is not connected to the output port of the audio processor 140, and is not connected to the output port of the audio processor 140 when the earphone 146 has been connected to the output port of the audio processor 140. However, both the speaker 144 and the earphone 146 may be connected simultaneously. The speaker 144 and the earphone 146 are used for voice communication, listening to music, and the like. According to an exemplary embodiment of the present invention, the audio processor 140 analyzes the background noise and automatically amplifies the volume of an audio signal in a frequency area in which it is difficult to hear the audio signal due to the background noise.

The memory 150 may include a program memory, a data memory, a non-volatile memory, and the like. The program memory stores program codes for controlling the general operation of a digital telephone and may comprise a flash memory. The data memory temporarily stores operation data which generates during operation of the mobile communication terminal, and may use, for example, a random access memory. The non-volatile memory stores system parameters and phone number databases registered for shortened dialing, and the like, and may use, for example, an Electric Erasable Programmable Read Only Memory (EEPROM).

The display unit 160 may include a Liquid Crystal Display (LCD) and displays various display data and letters/numbers generated by the mobile communication terminal 100 under the control of the control unit 110. The key input unit 170 includes a plurality of number/letter input keys, function keys, and keys for communication, so that the user can select a function, input data, and select a number.

Figure 2:
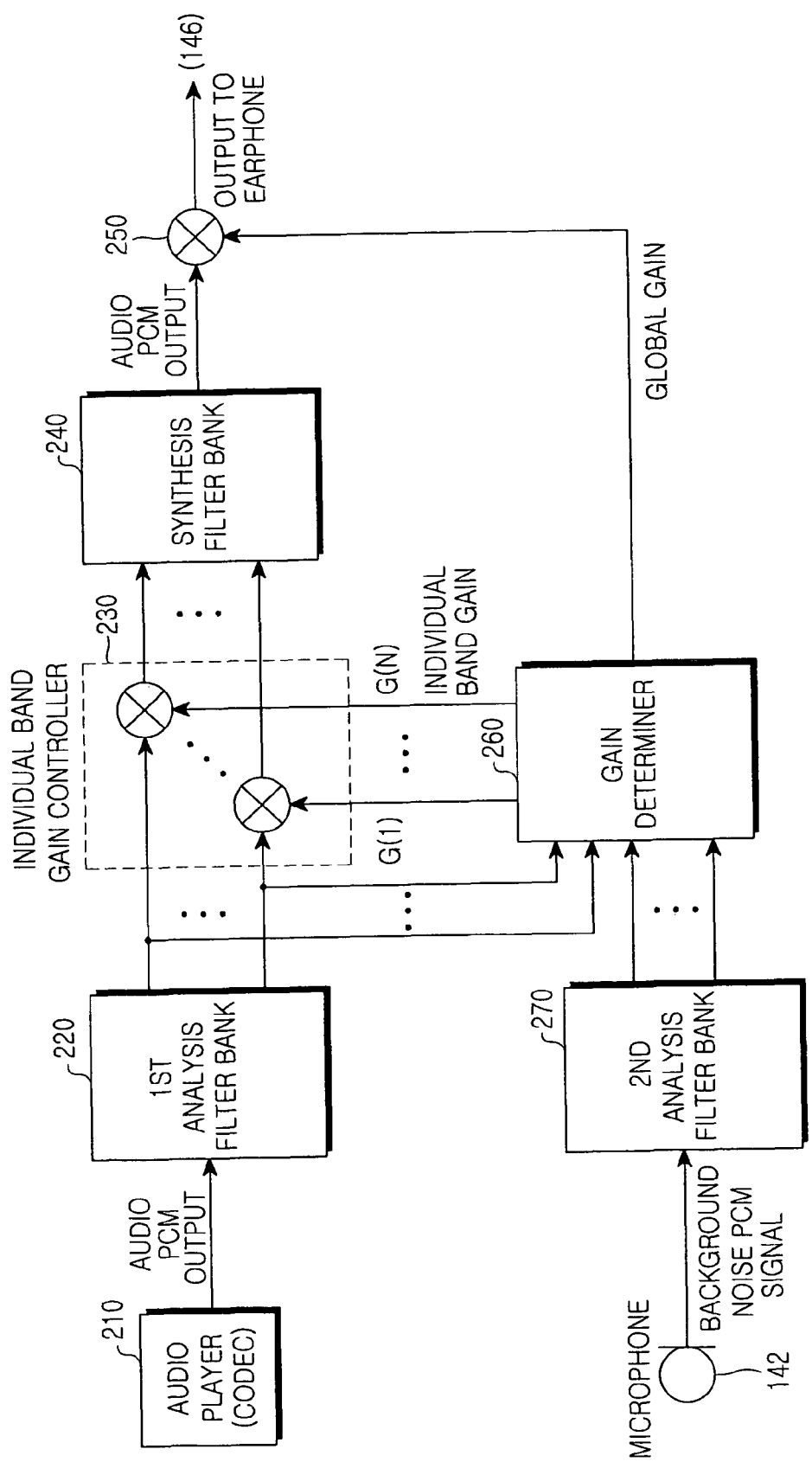
FIG. 2 is a block diagram of a volume control apparatus of an audio player of a mobile communication terminal according to an exemplary embodiment of the present invention.

FIG. 2 is a block diagram of a volume control apparatus of a mobile communication terminal according to an exemplary embodiment of the present invention. The audio player shown in FIG. 2 may be included in the audio processor 140 shown in FIG. 1.

Referring to FIG. 2, the audio player 210 corresponds to an audio CODEC for decoding an audio signal, which has been encoded according to an audio coding algorithm, into a Pulse Code Modulation (PCM) signal, and the first analysis filter bank 220 divides the decoded audio PCM signal into audio PCM signals of multiple frequency bands by sub-band coding. The individual band gain controller 230 multiplies the audio PCM signals input through individual bands by determined gains, and the synthesis filter bank 240 synthesizes the gain-controlled signals of the individual bands into one audio PCM signal of a time domain.

The global gain controller 250 controls the global gain for the synthesized audio signal. The individual band gains and the global gain are determined through analysis of the environmental noise by the gain determiner 260. The second analysis filter bank 270 performs nearly the same function as that of the first analysis filter bank 220, excepting that the second analysis filter bank 270 receives a surrounding noise PCM signal from the microphone 142 mounted in the mobile communication terminal while the first analysis filter bank 220 receives the decoded audio PCM signal. According to an exemplary embodiment, all signals input to the microphone while the audio player 210 operates without voice communication are considered as the background PCM signals. By the second analysis filter bank 270, the background PCM signal is divided into background PCM signals of multiple frequency bands through sub-band coding, and the divided background PCM signals are then input to the gain determiner 260.

The sub-band coding refers to coding of digital signals through an Analysis-By-Synthesis (ABS) method. According to the sub-band coding, an input signal may be divided into elements according to frequencies with proper intervals, which are subjected to band-division coding and are then output. For the band division, a poly-phase filter bank is used. The poly-phase filter bank is usually necessary in order to avoid an unnecessary operation during the filtering and is included in both the analysis filter banks 220 and 270 and the synthesis filter bank 240. The analysis filter banks 220 and 270 analyze signals of individual bands by using a filter bank which enables a Perfect-Reconstruction (PR) filter design for preventing aliasing that may occur during the division of the input signal into signals of multiple sub-bands.

Figure 3:
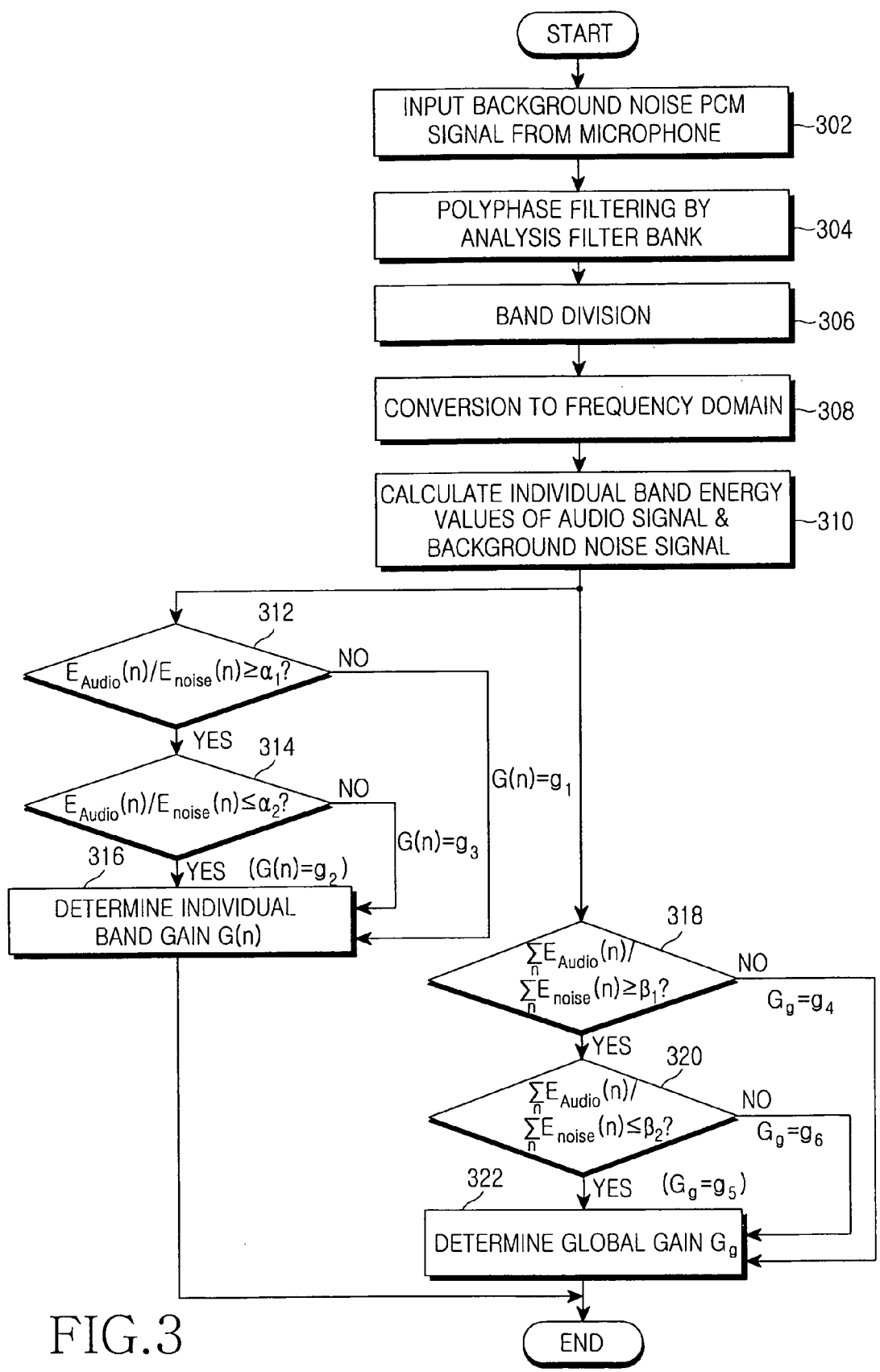
FIG. 3 is a flowchart of a process for determining gains for automatic volume control according to an exemplary embodiment of the present invention.
Figure 4:
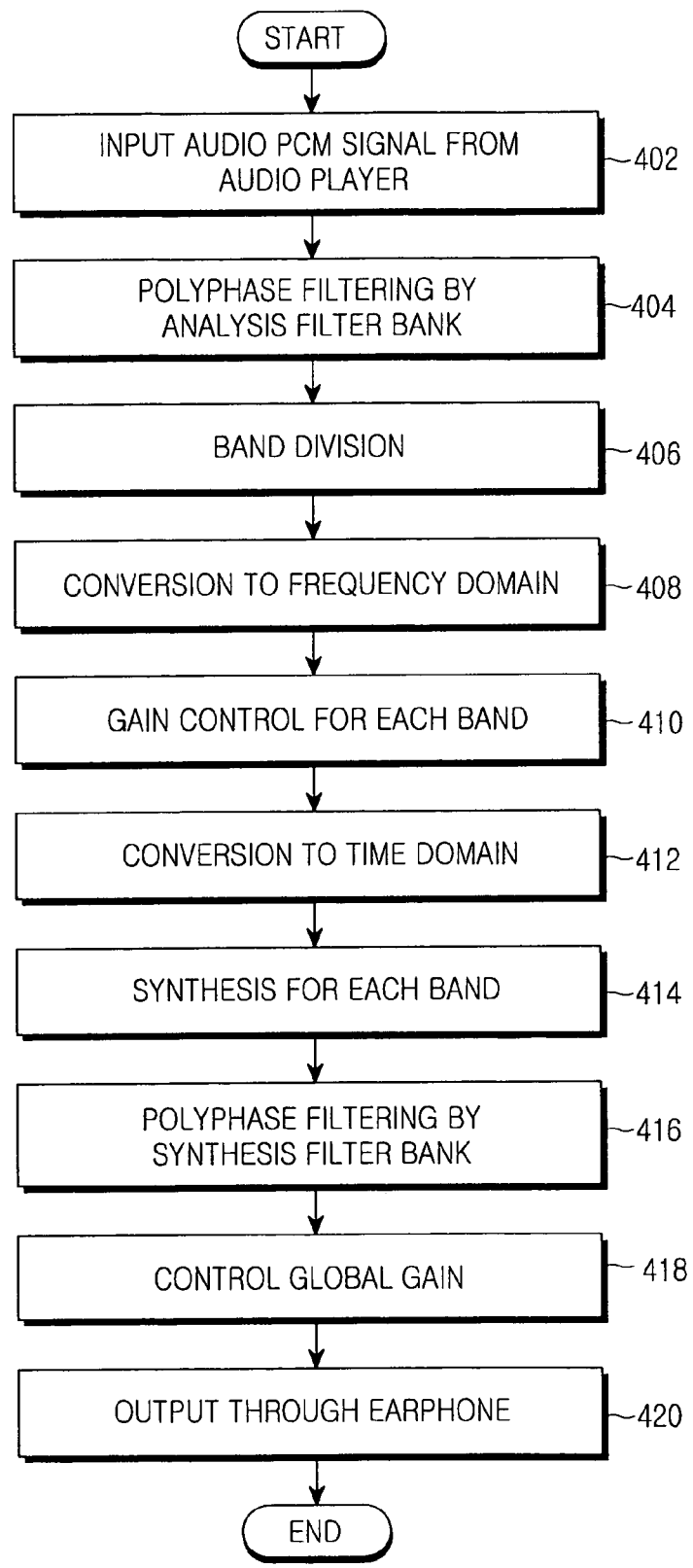
FIG. 4 is a flowchart of a process of automatic volume control according to an exemplary embodiment of the present invention.

FIGS. 3 and 4 are flowcharts of a gain determination operation and an automatic volume control operation according to an exemplary embodiment of the present invention, respectively. The flowchart of FIG. 3 relates to a process for determining the individual band gains and the global gain by using the background noise PCM signal input through the microphone 142, and the flowchart of FIG. 4 relates to a process for controlling the audio PCM signal input from the audio player 210 by using the individual band gains and the global gain.

Referring first to FIG. 3, the background noise PCM signal is input to the second analysis filter bank 270 from the microphone 142 in step 302. Then, the second analysis filter bank 270 polyphase-filters the background noise PCM signal in step 304, and divides the filtered background noise signal into F number of individual frequency band signals in step 306. The number and bandwidth of the frequency bands are determined based on the characteristic of the input audio PCM signal and a perceptible overall frequency bandwidth. For example, the frequency portion sensitive to human auditory organs may be divided into more compact frequency bands, while the other portion is divided into sparser frequency bands. In step 308, the divided individual frequency band background noise signals are converted to background noise signals of the frequency domain.

Meanwhile, in step 402 of FIG. 4, an audio PCM signal from the audio player 210 is input to the first analysis filter bank 220. The first analysis filter bank 220 polyphase-filters the audio PCM signal in step 404, and divides the filtered signal into F number of individual frequency band signals in step 406. Then, in step 408, the divided individual frequency band signals are converted to audio signals of the frequency domain.

Then, in step 310 of FIG. 3, the gain determiner 260 receives the individual frequency band audio signals from the first analysis filter bank 220 and the individual frequency band background noise signals from the second analysis filter bank 270 and calculates energy values of the individual band signals according to equations (1) and (2) below.

$$E_{Audio}(n) = \sum_f X(f)^2 \quad (1)$$

$$E_{Noise}(n) = \sum_f N(f)^2 \quad (2)$$

In equations (1) and (2), X(f) and N(f) refer to the audio signal and the background noise signal of each band after the frequency conversion, respectively. Further, $E_{Audio}(n)$ refers to an energy value of the audio signal calculated in the frequency band n, and $E_{Noise}(n)$ refers to an energy value of the background noise signal calculated in the frequency band n.

Then, the gain determiner 260 compares the ratio between the energy values with thresholds α in steps 312 and 314, and then determines the individual band gain G(n) by using equations (3) to (5) below in step 316. Equations (3) to (5) show examples of determining the individual band gains $g_1$, $g_2$, and $g_3$ by using two thresholds $\alpha_1$ and $\alpha_2$, wherein the thresholds have a relation of $\alpha_1 < \alpha_2$ and the gains have a relation of $g_1 > g_2 > g_3$.

if $E_{Audio}(n)/E_{Noise}(n) < \alpha_1$, $G(n) = g_1$ \quad (3)

if $\alpha_2 \geq E_{Audio}(n)/E_{Noise}(n) \geq \alpha_1$, $G(n) = g_2$ \quad (4)

if $\alpha_2 < E_{Audio}(n)/E_{Noise}(n)$, $G(n) = g_3$ \quad (5)

Further, the gain determiner 260 compares the ratio between sums of the energy values with thresholds β in steps 318 and 320, and then determines the global gain $G_g$ by using equations (6) to (8) below in step 322. Equations (6) to (8) show examples of determining the individual band gains $g_4$, $g_5$, and $g_6$ by using two thresholds $\beta_1$ and $\beta_2$.

$$\text{if } \sum_n E_{Audio}(n) / \sum_n E_{Noise}(n) < \beta_1, \quad (6)$$

$$G_g = g_4$$

$$\text{if } \beta_2 \geq \sum_n E_{Audio}(n) / \sum_n E_{Noise}(n) \geq \beta_1, \quad (7)$$

$$G_g = g_5$$

$$\text{if } \beta_2 < \sum_n E_{Audio}(n) / \sum_n E_{Noise}(n), \quad (8)$$

$$G_g = g_6$$

In equations (6) to (8), the thresholds have a relation of $\beta_1 < \beta_2$ and the gains have a relation of $g_4 > g_5 > g_6$. The thresholds $\alpha_1$, $\alpha_2$, $\beta_1$, and $\beta_2$ and the gains $g_1$ to $g_6$ are determined through experiments using auditory characteristics such as the masking effect curve, and the like. As already described above, the masking effect implies a phenomenon in that, from among audio signals sensed by auditory organs, a signal having a sufficiently large amplitude on the frequency axis or time axis covers small signals around the signal and prevents the small signals from being heard. Therefore, the gain values are determined so that an audio signal level of a corresponding band exceeds the masking effect curve.

The individual band gains and the global gain determined as described above are provided to the individual band gain controller 230 and the global band controller 250, respectively. In step 410 of FIG. 4, the individual band gain controller 230 multiplies the frequency-converted individual frequency band audio signals by the individual band gains, respectively, and then outputs the products.

The synthesis filter bank 240 converts the gain-controlled individual band audio signals from the individual band gain controller 230 to signals of the time domain in step 412, synthesizes the converted audio signals of the time domain into a global band audio signal in step 414, and then polyphase-filters the synthesized audio signal, thereby outputting an audio PCM signal in step 416. The global band gain controller 250 performs gain control by multiplying the audio PCM signal from the synthesis filter bank 240 by the global band gain in step 418, and then outputs the gain-controlled audio PCM signal through the earphone 146 or the speaker 144 in step 420, so that the user can listen to sound by the gain-controlled audio PCM signal.

A mobile communication terminal according to an exemplary embodiment of the present invention as described above is advantageous in listening to audio reproduced by the mobile communication terminal in an environment which has environmental noise. According to an exemplary embodiment of the present invention, it is possible to easily listen to the part disturbed by the environmental noise by controlling the individual band gains or the global gain based on the human auditory characteristic. Further, exemplary embodiments of the present invention do not require an additional device or hardware, because they use an existing microphone mounted in the terminal together with software in order to control the volume.

Certain exemplary embodiments of the present invention can also be embodied as computer-readable codes on a computer-readable recording medium. The computer-readable recording medium is any data storage device that can store data which can thereafter be read by a computer system.

Examples of the computer-readable recording medium include, but are not limited to, read-only memory (ROM), random-access memory (RAM), CD-ROMs, magnetic tapes, floppy disks, optical data storage devices. The computer-readable recording medium can also be distributed over network-coupled computer systems so that the computer-readable code is stored and executed in a distributed fashion. Also, functional programs, codes, and code segments for accomplishing the present invention can be easily construed as within the scope of the invention by programmers skilled in the art to which the present invention pertains.

While the invention has been shown and described with reference to certain exemplary embodiments thereof, it will be understood by those skilled in the art that various changes in form and details may be made therein without departing from the spirit and scope of the invention as defined by the appended claims and the full scope of equivalents thereof.

What is claimed is:

1. A method for controlling a volume of an audio signal reproduced by a mobile communication terminal equipped with a microphone for voice communication, the method comprising:
    receiving an audio signal;
    dividing the audio signal into individual frequency band audio signals, which correspond to multiple frequency bands, by sub-band filtering;
    receiving a background noise signal introduced through the microphone;
    dividing the background noise signal into individual frequency band background noise signals, which correspond to multiple frequency bands, by sub-band filtering;
    determining individual band gains of the multiple frequency bands based on a result obtained by comparing the individual frequency band background noise signals with the individual frequency band audio signals;
    determining a global band gain of an overall frequency band including the multiple frequency bands;
    gain-controlling the audio signal using the individual band gains and the global band gain; and
    outputting a gain-controlled audio signal.

2. The method as claimed in claim 1, wherein the receiving the audio signal comprises receiving a decoded audio signal.

3. The method as claimed in claim 1, further comprising calculating first energy values of the individual frequency band background noise signals.

4. The method as claimed in claim 3, further comprising the step of
    calculating second energy values of the individual frequency band audio signals.

5. The method as claimed in claim 1, wherein the gain-controlling of the audio signal further comprises:
    multiplying the individual frequency band audio signals by the individual band gains, respectively;
    producing a synthesized audio signal by synthesizing products of the multiplication between the individual frequency band audio signals and the individual band gains; and
    generating the gain-controlled audio signal by multiplying the synthesized audio signal by the global band gain.

6. The method as claimed in claim 5, wherein the determining of the individual band gains of the multiple frequency bands comprises comparing ratios of the second energy values to the first energy values with at least one threshold, wherein the individual band gain values are determined based on the results obtained by the comparing of the ratios.

7. The method as claimed in claim 5, wherein the determining of the global band gain of the overall frequency band comprises comparing ratios of sums of the second energy values to sums of the first energy values with at least one threshold, wherein the global band gain is determined based on a result obtained by the comparing of the ratios of the sums.

8. A mobile communication terminal, which is equipped with a microphone for voice communication and can reproduce an audio signal, the mobile communication terminal comprising:
    a first analysis filter bank for receiving an audio signal to be reproduced and dividing the audio signal into individual frequency band audio signals, which correspond to multiple frequency bands, respectively;
    a second analysis filter bank for receiving a background noise signal introduced through the microphone and dividing the background noise signal into individual frequency band background noise signals, which correspond to multiple frequency bands, respectively;
    a gain determiner for determining individual band gains of the multiple frequency bands and a global band gain of an overall frequency band including the multiple frequency bands by using the individual frequency band audio signals and the individual frequency band background noise signals;
    an individual band gain controller for multiplying the individual frequency band audio signals by the individual band gains, respectively;
    a synthesis filter bank for producing a synthesized audio signal by synthesizing products of the multiplication between the individual frequency band audio signals and the individual band gains; and
    a global band gain controller for generating a gain-controlled audio signal by multiplying the synthesized audio signal by the global band gain.

9. The mobile communication terminal as claimed in claim 8, wherein the audio signal is a decoded audio signal.

10. The mobile communication terminal as claimed in claim 8, wherein the first analysis filter bank and the second analysis filter bank divide the audio signal and the background noise signal through sub-band filtering, respectively.

11. The mobile communication terminal as claimed in claim 8, wherein the individual band gain controller and the global band gain controller calculate first energy values of the individual frequency band background noise signals and second energy values of the individual frequency band audio signals and determine gain values as an individual band gain of a corresponding frequency band, based on a result obtained by comparing ratios of the second energy values to the first energy values with at least one threshold.

12. The mobile communication terminal as claimed in claim 11, wherein the individual band gain controller and the global band gain controller determine gain values as the global band gain, based on a result obtained by comparing ratios of sums of the second energy values to sums of the first energy values with at least one threshold.

13. A computer readable medium device having stored thereon instructions for executing a method for controlling a volume of an audio signal reproduced by a mobile communication terminal equipped with a microphone for voice communication, the instructions comprising:
    a first set of instructions for receiving an audio signal;
    a second set of dividing the audio signal into individual frequency band audio signals, which correspond to the multiple frequency bands, by sub-band filtering;
    a third set of instructions for receiving a background noise signal through the microphone;
    a fourth set of instructions for dividing the background noise signal into individual frequency band background noise signals, which correspond to multiple frequency bands, by sub-band filtering;
    a fifth set of instructions for determining individual band gains of the multiple frequency bands based on a result obtained by comparing the individual frequency band background noise signals with the individual frequency band audio signals;

a sixth set of instructions for determining a global band gain of an overall frequency band including the multiple frequency bands;

a seventh set of instructions for gain-controlling the audio signal using the individual band gains and the global band gain; and an eighth set of instructions for outputting a gain-controlled audio signal.

14. The computer readable medium device as claimed in claim 13, wherein the first set of instructions for receiving the audio signal comprise instructions for receiving a decoded audio signal.

15. The computer readable medium device as claimed in claim 13, wherein the second set of instructions for receiving the background noise signal comprise instructions for receiving the background noise signal introduced through the microphone.

16. The computer readable medium device as claimed in claim 13, wherein the second set of instructions for receiving the background noise signal comprise:

instructions for dividing the background noise signal into individual frequency band background noise signals, which correspond to multiple frequency bands, respectively; and instructions for calculating first energy values of the individual frequency band background noise signals.

17. The computer readable medium device as claimed in claim 16, wherein the first set of instructions for receiving of the audio signal comprises:

instructions for dividing the audio signal into individual frequency band audio signals, which correspond to the multiple frequency bands, respectively; and instructions for calculating second energy values of the individual frequency band audio signals.

18. A mobile communication terminal, which is equipped with a microphone for voice communication and can reproduce an audio signal, the mobile communication terminal comprising:

a means for receiving an audio signal to be reproduced and dividing the audio signal into individual frequency band audio signals, which correspond to multiple frequency bands, respectively;

a means for receiving a background noise signal and dividing the background noise signal into individual frequency band background noise signals, which correspond to multiple frequency bands, respectively;

a means for determining individual band gains of the multiple frequency bands and a global band gain of an overall frequency band including the multiple frequency bands by using the individual frequency band audio signals and the individual frequency band background noise signals;

a means for multiplying the individual frequency band audio signals by the individual band gains, respectively;

a means for producing a synthesized audio signal by synthesizing products of the multiplication between the individual frequency band audio signals and the individual band gains; and a means for generating a gain-controlled audio signal by multiplying the synthesized audio signal by the global band gain.

19. The method as claimed in claim 1, wherein first energy values of the individual frequency band background noise signals are calculated according to equation below, $$E_{Noise}(n) = \sum_f N(f)^2$$

where the N(f) denotes the background noise signal, n denotes a frequency band, and the $E_{Noise}(n)$ denotes an energy value of the background noise signal calculated in the frequency band n.

20. The method as claimed in claim 1, wherein second energy values of the individual frequency band audio signals are calculated according to equation below, $$E_{Audio}(n) = \sum_f X(f)^2$$

where the X(f) denotes the audio signal, n denotes a frequency band, and the $E_{Audio}(n)$ denotes an energy value of the audio signal calculated in the frequency band n.

21. The computer readable medium as claimed in claim 13, wherein first energy values of the individual frequency band background noise signals are calculated according to equation below, $$E_{Noise}(n) = \sum_f N(f)^2$$

where the N(f) denotes the background noise signal, n denotes a frequency band, and the $E_{Noise}(n)$ denotes an energy value of the background noise signal calculated in the frequency band n.

22. The computer readable medium as claimed in claim 13, wherein second energy values of the individual frequency band audio signals are calculated according to equation below, $$E_{Audio}(n) = \sum_f X(f)^2$$

where the X(f) denotes the audio signal, n denotes a frequency band, and the $E_{Audio}(n)$ denotes an energy value of the audio signal calculated in the frequency band n.

* * * * *